US008957707B2

(12) United States Patent
Chang et al.

(10) Patent No.: US 8,957,707 B2
(45) Date of Patent: Feb. 17, 2015

(54) POSITIVE/NEGATIVE SAMPLING AND HOLDING CIRCUIT

(75) Inventors: Chin-Fu Chang, Taipei (TW); Guang-Huei Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/609,524

(22) Filed: Sep. 11, 2012

(65) Prior Publication Data

US 2013/0135012 A1 May 30, 2013

Related U.S. Application Data

(60) Provisional application No. 61/564,995, filed on Nov. 30, 2011.

(30) Foreign Application Priority Data

Jan. 5, 2012 (TW) ............................ 101100388 A

(51) Int. Cl.
*H03K 17/00* (2006.01)

(52) U.S. Cl.
USPC ........................................................... 327/94

(58) Field of Classification Search
USPC .......... 327/91, 94, 95, 96, 337; 341/122, 123, 341/124, 125
See application file for complete search history.

(56) References Cited

U.S. PATENT DOCUMENTS

| | | | | |
|---|---|---|---|---|
| 7,579,885 | B2 * | 8/2009 | Rossi | 327/124 |
| 8,368,430 | B2 * | 2/2013 | Watanabe | 327/96 |
| 8,497,746 | B2 * | 7/2013 | Visconti et al. | 333/173 |
| 2004/0232948 | A1 * | 11/2004 | Rossi | 327/94 |
| 2009/0201051 | A1 * | 8/2009 | Ono et al. | 327/96 |
| 2011/0069036 | A1 * | 3/2011 | Anno | 345/174 |
| 2011/0279148 | A1 * | 11/2011 | Watanabe | 327/96 |
| 2012/0133417 | A1 * | 5/2012 | Darzy | 327/337 |
| 2012/0256869 | A1 * | 10/2012 | Walsh et al. | 345/174 |

FOREIGN PATENT DOCUMENTS

CN 101040441 A 9/2007

* cited by examiner

*Primary Examiner* — Gary L Laxton
*Assistant Examiner* — Afework Demisse
(74) *Attorney, Agent, or Firm* — WPAT, PC; Justin King

(57) ABSTRACT

A positive/negative sampling and holding (S/H) circuit is disclosed herein. The positive/negative S/H circuit includes an operational amplifier, a first capacitor, a second capacitor being parallel with the first capacitor and forming an integration circuit with the operational amplifier, and several discharge switches correspondingly connecting discharge paths of the first and the second capacitors to control the first and the second capacitors to output a first sampling signal and a second sampling signal respectively, and herein, the first and the second sampling signals has the same magnitude but opposite voltage polarities.

16 Claims, 3 Drawing Sheets

10

SENSOR
120

POSITIVE/
NEGATIVE
S/H
CIRCUIT
110

A

B $V_B$ $V_A$

Vdd/2

POSITIVE/NEGATIVE SAMPLING AND HOLDING CIRCUIT

CROSS REFERENCE TO RELATED APPLICATIONS

This application claims the benefit of TW Application No. 101100388, filed on Jan. 5, 2012 and U.S. Provisional Application No. 61/564,995, filed on Nov. 30, 2011, which are herein incorporated by reference for all intents and purposes.

BACKGROUND OF THE INVENTION

1. Field of the Invention

The present invention relates to a sampling and holding (S/H) circuit, and more particularly, to a positive/negative S/H circuit that synchronously outputs positive/negative S/H results.

2. Description of the Prior Art

Sampling and holding (S/H) circuits for traditional touch panels usually operate on only positive or negative clock cycles, thus 50% of the clock cycle is wasted. Alternatively, some S/H circuits employ inverters so that they are able to operate on both positive and negative clock cycles (e.g. negative pulses are converted into positive pulses, so that a S/H circuit that operates only on positive clock cycles is able to operate on what were originally negative clock cycles). However, transmission time delay of the inverters may cause pulse overlap in high-speed S/H circuits (e.g. assuming a negative pulse is converted into a positive pulse by an inverter and a 5% transmission time delay is introduced, then 5% of pulse time at the end of the waveform of this positive pulse will overlap with 5% of pulse time at the beginning of the waveform of the next positive pulse), such clock overlapping issue is even more prominent in high-frequency S/H circuits or inverters with larger transmission time delays. This causes disorder in operations of the S/H circuits.

Alternatively, some S/H circuits use inverters to perform direct phase conversion on the results sampled and held during positive clock cycles and then output the converted results. As such, positive/negative S/H results can be outputted, but transmission time delay in the inverters may cause the converted results to be outputted slower, so this output method is not synchronous, and in high-speed S/H circuits, signal waiting times of subsequent circuits are also prolonged.

From the above shortcomings, the present invention provides a positive/negative S/H circuit that solves the asynchronous output problem for positive/negative sampling results of the prior-art S/H circuits.

SUMMARY OF THE INVENTION

An objective of the present invention is to simultaneously sample a sensing signal with two capacitors of a S/H circuit via a plurality of charge switches, such that the S/H results of the two capacitors are equal.

Another objective of the present invention is simultaneously output positive/negative S/H results from two capacitors of a S/H circuit via a plurality of discharge switches.

Therefore, the present invention discloses a positive/negative sampling and holding (S/H) circuit, which may include: an operational amplifier; a first capacitor; a second capacitor connected in parallel with the operational amplifier forming an integration circuit; and a plurality of discharge switches correspondingly connected to discharge paths of the respective first and second capacitors for controlling the first and second capacitors to simultaneously output a respective first sampling signal and a second sampling signal, wherein the first and second sampling signals have the same magnitude but opposite polarities.

The above positive/negative S/H circuit may further include a plurality of charge switches connected to charge paths of the respective first and second capacitors for controlling the first and second capacitors to simultaneously sample a sensing signal of a sensor to produce a respective first sampling signal and a second sampling signal.

In the above positive/negative S/H circuit, the charge switches control the speed at which the first and second capacitors sample the sensing signal.

In the above positive/negative S/H circuit, the charge switches control the first and second capacitors to simultaneously sample the sensing signals multiple times, and accumulate the samples to form the first and second sampling signals.

In the above positive/negative S/H circuit, the charge switches further control the number of samples of the sensing signal taken by the first and second capacitors before outputting the first and second sampling signals.

In the above positive/negative S/H circuit, the first and second capacitors simultaneously output the first and second sampling signals at a determined time.

In the above positive/negative S/H circuit, the discharge switches control the duration of the determined time.

In the above positive/negative S/H circuit, the charge switches are controlled by a first switch control signal.

In the above positive/negative S/H circuit, the discharge switches are controlled by a second switch control signal.

The above positive/negative S/H circuit may further include a first clear switch connected with the first capacitor controlled by a third switch control signal.

The above positive/negative S/H circuit may further include a second clear switch connected with the second capacitor controlled by a third switch control signal.

The above positive/negative S/H circuit may further include a sample control switch connected in series between the sensor and a reference potential of an integrator, the sample control switch is controlled by a fourth switch control signal, wherein the fourth switch control signal includes a phase-inverted version of the first switch control signal.

In the above positive/negative S/H circuit, the sensor includes a conductive wire of a touch panel.

The present invention also discloses a positive/negative S/H circuit, which may include: an operational amplifier including a first input, a second input and an output, wherein the first input is electrically coupled to a sample input and the second input is electrically coupled to a reference voltage; a first capacitor including a first end and a second end, wherein the first end is electrically coupled to the first input via a first switch, and the second end is electrically coupled to the output via a second switch; and a second capacitor including a third end and a fourth end, wherein the third end is electrically coupled to the first input via a third switch, and the fourth end is electrically coupled to the output via a fourth switch, wherein the second end is further electrically coupled to the reference voltage via a fifth switch, the first end is further electrically coupled to a first sample output via a sixth switch, the fourth end is further electrically coupled to a second sample output via a seventh switch, and the third end is further electrically coupled to the reference voltage via an eighth switch.

The above positive/negative S/H circuit may further include a ninth switch connected in parallel with the first capacitor.

The above positive/negative S/H circuit may further include a tenth switch connected in parallel with the second capacitor.

The above positive/negative S/H circuit may further include an eleventh switch connected in series between the sample input and the second input.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
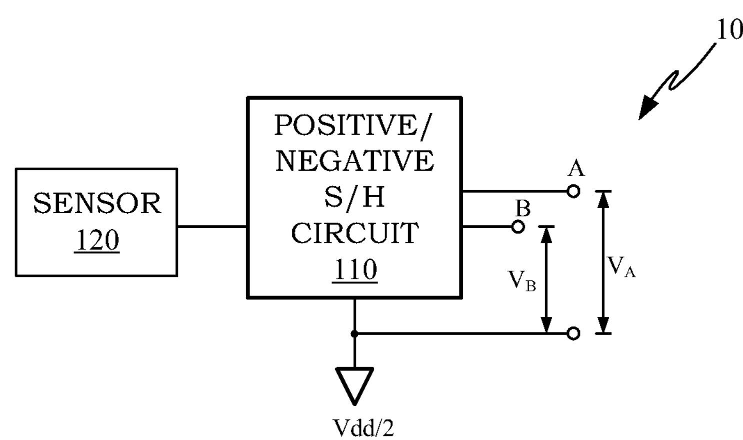
FIG. 1 is a block diagram depicting a preferred embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1, a block diagram depicting a preferred embodiment 10 of the present invention is shown. A positive/negative sampling and holding (S/H) circuit 110 samples a sensing signal of a sensor 120, and outputs a first sampling signal $V_A$ and a second sampling signal $V_B$ at a determined time, wherein the first and second sampling signal $V_A$ and $V_B$ are of the same magnitude and opposite polarities. In an example of the present invention, the positive/negative S/H circuit 110 samples the sensing signal of the sensor multiple times and accumulates and stores the result, and thereafter, outputs it to two output terminals A and B, becoming the first and second sampling signal $V_A$ and $V_B$, wherein the positive/negative S/H circuit 110, and the output terminals A and B all uses the same common potential as a reference voltage, it can be, for example, half of the power supply voltage (Vdd/2), but is not limited thereto. In another embodiment of the present invention, the positive/negative S/H circuit 110 only senses the whole sensing signal of the sensor once and outputs it; again, the present invention is not limited to this.

Figure 2A:
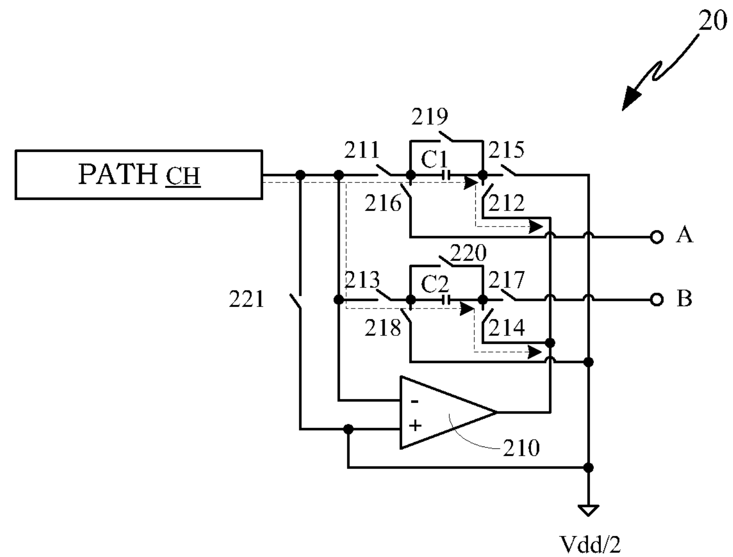
FIG. 2A is a circuit diagram illustrating a signal S/H path for a preferred circuit.
Figure 2B:
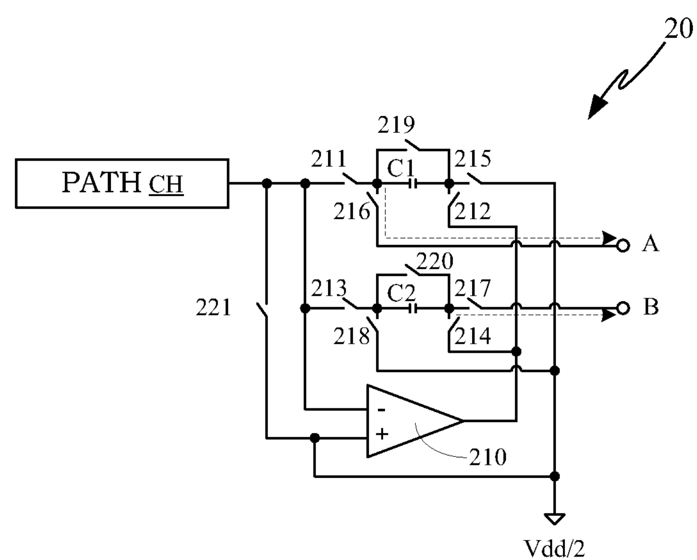
FIG. 2B is a circuit diagram illustrating a S/H signal output path for the preferred circuit shown in FIG. 2A.
Figure 3:
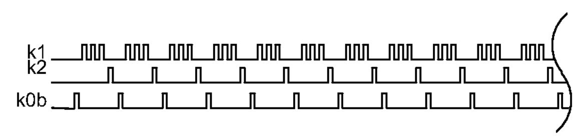
FIG. 3 is a preferred timing diagram of the circuit shown in FIGS. 2A and 2B.

Referring to FIGS. 2A, 2B and 3, circuit diagrams illustrating a signal S/H path and a S/H signal output path for a preferred circuit 20 of FIG. 1 and a preferring timing diagram thereof are shown, respectively. This preferred circuit 20 includes an operational amplifier (e.g. 210), two capacitors (e.g. C1 and C2) and a plurality of switches (e.g. 211, 212, 213, 214, 215, 217, 217, 218, 219, 220, 221), wherein the two capacitors are connected in parallel first, forming an integration circuit with the operational amplifier. The plurality of switches are correspondingly connected to the charge/discharge paths of the two capacitors, thereby controlling charge/discharge times of the capacitors and the polarity of charge/discharge.

Referring still to FIGS. 2A and 3, when a first switch control signal k1 for controlling a plurality of charge switches (e.g. a first switch 211, a second switch 212, a third switch 213, and a fourth switch 214) is a positive pulse, the charge switches 211, 212, 213 and 214 are then turned on, forming a corresponding charge path with the first capacitor C1 and the second capacitor C2, respectively, and the operational amplifier 210 (as shown by dotted lines in FIG. 2A). At this time, a sensing signal on the path CH charges the first capacitor C1 and the second capacitor C2, i.e. the positive/negative S/H circuit samples the sensing signal of a corresponding sensor via the path CH. In this embodiment, the first capacitor C1 and the second capacitor C2 simultaneously samples the same sensing signal, thus the results sampled by the capacitors will be the same under the conditions that the two capacitances are the same and the sampling times are the same.

Referring still to FIGS. 2B and 3, when a second switch control signal k2 for controlling a plurality of discharge switches (e.g. a fifth switch 215, a sixth switch 216, a seventh switch 217 and an eighth switch 218) is a positive pulse, the discharge switches 215, 216, 217 and 218 are turned on, forming a corresponding discharge path with the first capacitor C1 and the second capacitor C2, respectively, and a reference potential (e.g. half of the power supply voltage (Vdd/2)) (as shown by dotted lines in FIG. 2B). At this time, the first capacitor C1 and the second capacitor C2 discharge to respective output terminals A and B, i.e., the positive/negative S/H circuit outputs the sampled and held results. In this embodiment, the signals outputted by the first capacitor C1 and the second capacitor C2 to the output terminals A and B have different polarities, so the two capacitors output the S/H results with the same magnitude but opposite polarities.

In this embodiment, three k1 positive pulses are followed by one k2 positive pulse; in other words, the positive/negative S/H circuit in this embodiment performs 3 samplings of short durations, accumulates them and then outputs the results to the two output terminals. The number of short-duration samplings for accumulation performed by the positive/negative S/H circuits can be adjusted according to actual needs, and the present invention is not limited to this. From another perspective, the charge switches control the speed at which the positive/negative S/H circuit (the first and second capacitors) multi-samples the sensing signal. In other words, when the charge switches are turned on more times before the positive/negative S/H circuit outputs the S/H results, the number of samples taken on the sensing signal by the positive/negative S/H circuit in the determined time also increases. In addition, the discharge switches also control the duration of the determined time. In other words, when the discharge switches are turned on more frequently, the duration of the determined time is shorter, and the number of samplings taken by the positive/negative S/H circuit increases correspondingly.

In an example of the present invention, there are a plurality of patterns for the k1 positive pulses and k2 positive pulses. Each pattern can be run and tested for a plurality of clock cycles, and the pattern with the best signal is selected. Alternatively, any arbitrary pattern that meets the needs can be selected. In addition, patterns are sequentially tested until an arbitrary pattern that meets the needs appears, thereafter the test run is finished and this pattern is selected. As such, external environmental interference can be minimized and a pattern is adjusted according to system needs.

In addition, according to the discharge paths of the first and second capacitors C1 and C2, the positive/negative S/H circuit of this embodiment simultaneously outputs positive/negative sampling results. For example, the first capacitor C1 outputs a first sampling result (a positive sampling result) via the sixth switch 216 to the output terminal A using Vdd/2 as a reference potential via the fifth switch 215; the second capacitor C2 outputs a second sampling result (a negative sampling result) via the seventh switch 217 to the output terminal B using Vdd/2 as a reference potential via the eighth switch 218.

Referring again to FIGS. 2A, 2B and 3, when a third switch control signal k0_b_ for controlling two clear switches (e.g. a first clear switch 219 and a second clear switch 220) is a positive pulse, the ninth switch 219 and the tenth switch 220 are turned on and the first capacitor C1 and the second capacitor C2 are cleared. In this embodiment, a k0_b_ positive pulse occurs before every three k1 positive pulses and/or after every one k2 positive pulse. This means that the positive/negative S/H circuit performs clearing of the first and second capacitors C1 and C2 before multi-sampling and accumulating and/or after outputting S/H results to ensure no remaining charge in the capacitors that may affect the next sampling results. A sample control switch 221 is controlled by a fourth switch control signal (an inverse signal of k1). When the sample control switch 221 is turned on, the positive/negative S/H circuit cannot perform sampling and accumulating operations.

In terms of the circuit architecture, referring again to FIGS. 2A and 2B, the preferred circuit 20 of the present invention includes: an operational amplifier 210 having a first input, a second input and a output, wherein the first input is electrically coupled to a sample input (path CH) and the second input is electrically coupled to a reference voltage (e.g. Vdd/2); a first capacitor C1 with a first end and a second end, wherein the first end is electrically coupled to the first input via a first switch 211, and the second end is electrically coupled to the output via a second switch 212; and a second capacitor C2 with a third end and a fourth end, wherein the third end is electrically coupled to the first input via a third switch 213, the fourth end is electrically coupled to the output via a fourth switch 214, wherein the second end is further electrically coupled to the reference voltage via a fifth switch 215, the first end is further electrically coupled to a first sample output (an output terminal A) via a sixth switch 216, the fourth end is further electrically coupled to a second sample output (an output terminal B) via a seventh switch 217 and the third end is further electrically coupled to the reference voltage via an eighth switch 218. In addition, this embodiment further includes a ninth switch 219 connected in parallel with the first capacitor C1, a tenth switch 220 connected in parallel with the second capacitor C2 and a eleventh switch 221 connected in series between the sample input and the second input.

Finally, the sensor as mentioned in all embodiments of the present invention may refer to one of a plurality of conductive wires in a touch panel.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A positive/negative sampling and holding (S/H) circuit, comprising:

an operational amplifier;

a first capacitor;

a second capacitor connected in parallel with the first capacitor, and with the operational amplifier forming an integration circuit;

a plurality of discharge switches correspondingly connected to discharge paths of the respective first and second capacitors for controlling the first and second capacitors to simultaneously output a respective first sampling signal and a second sampling signal, wherein the first and second sampling signals have the same magnitude but opposite polarities; and a sample control switch connected in series between a sensor and a reference potential of the integration circuit, the sample control switch is controlled by a fourth switch control signal, wherein the fourth switch control signal includes a phase-inverted version of a first switch control signal.

2. The positive/negative S/H circuit of claim 1, further comprising a plurality of charge switches connected to charge paths of the respective first and second capacitors for controlling the first and second capacitors to simultaneously sample a sensing signal of the sensor to produce the respective first sampling signal and the second sampling signal.

3. The positive/negative S/H circuit of claim 2, wherein the charge switches control the speed at which the first and second capacitors sample the sensing signal.

4. The positive/negative S/H circuit of claim 2, wherein the charge switches control the first and second capacitors to simultaneously sample the sensing signals multiple times, and accumulate the samples to form the first and second sampling signals.

5. The positive/negative S/H circuit of claim 4, wherein the charge switches further control the number of samples of the sensing signal taken by the first and second capacitors before outputting the first and second sampling signals.

6. The positive/negative S/H circuit of claim 2, wherein the charge switches are controlled by the first switch control signal.

7. The positive/negative S/H circuit of claim 2, wherein the discharge switches are controlled by a second switch control signal.

8. The positive/negative S/H circuit of claim 2, wherein the sensor includes a conductive wire of a touch panel.

9. The positive/negative S/H circuit of claim 1, wherein the first and second capacitors simultaneously output the first and second sampling signals at a determined time.

10. The positive/negative S/H circuit of claim 9, wherein the discharge switches control the duration of the determined time.

11. The positive/negative S/H circuit of claim 1, further comprising a first clear switch connected in parallel with the first capacitor controlled by a third switch control signal.

12. The positive/negative S/H circuit of claim 1, further comprising a second clear switch connected in parallel with the second capacitor controlled by a third switch control signal.

13. A positive/negative S/H circuit, comprising:

an operational amplifier including a first input, a second input and an output, wherein the first input is electrically coupled to a sample input and the second input is electrically coupled to a reference voltage;

a first capacitor including a first end and a second end, wherein the first end is electrically coupled to the first input via a first switch, and the second end is electrically coupled to the output via a second switch; and a second capacitor including a third end and a fourth end, wherein the third end is electrically coupled to the first input via a third switch, and the fourth end is electrically coupled to the output via a fourth switch, wherein the second end is further electrically coupled to the reference voltage via a fifth switch, the first end is further electrically coupled to a first sample output via a sixth switch, the fourth end is further electrically coupled to a second sample output via a seventh switch, and the third end is further electrically coupled to the reference voltage via an eighth switch.

14. The positive/negative S/H circuit of claim 13, further comprising a ninth switch connected in parallel with the first capacitor.

15. The positive/negative S/H circuit of claim 13, further comprising a tenth switch connected in parallel with the second capacitor.

16. The positive/negative S/H circuit of claim 13, further comprising an eleventh switch connected in series between the sample input and the second input.

* * * * *